United States Patent
Mizuno

(10) Patent No.: US 6,757,627 B2
(45) Date of Patent: Jun. 29, 2004

(54) PHOTO-DETECTING APPARATUS

(75) Inventor: Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 263 days.

(21) Appl. No.: 09/983,922

(22) Filed: Oct. 26, 2001

(65) Prior Publication Data
US 2002/0029122 A1 Mar. 7, 2002

Related U.S. Application Data

(63) Continuation-in-part of application No. PCT/JP00/02789, filed on Apr. 27, 2000.

(30) Foreign Application Priority Data

Apr. 27, 1999 (JP) .......................... P11-119824

(51) Int. Cl.[7] .............................................. G01R 27/00
(52) U.S. Cl. .................... 702/65; 257/431; 356/221
(58) Field of Search .............................. 702/64–65, 159, 702/172, 134–135, 189–195; 257/443–444, 431; 356/215, 218, 221, 445–448; 250/205–206, 359.11, 214 A, 214 SW

(56) References Cited

U.S. PATENT DOCUMENTS

| | | | | |
|---|---|---|---|---|
| 4,902,886 A | * | 2/1990 | Smisko ................... | 250/214 R |
| 5,276,508 A | * | 1/1994 | Boisvert et al. ......... | 348/223.1 |
| 5,329,312 A | * | 7/1994 | Boisvert et al. .......... | 348/256 |
| 5,838,176 A | * | 11/1998 | Delbruck et al. .............. | 327/95 |
| 5,877,715 A | * | 3/1999 | Gowda et al. ............... | 341/122 |
| 5,949,483 A | * | 9/1999 | Fossum et al. ............. | 348/303 |
| 6,018,364 A | * | 1/2000 | Mangelsdorf ............... | 348/241 |
| 6,025,875 A | * | 2/2000 | Vu et al. ..................... | 348/241 |
| 6,031,570 A | * | 2/2000 | Yang et al. ................. | 348/300 |
| 6,201,572 B1 | * | 3/2001 | Chou ......................... | 348/241 |

FOREIGN PATENT DOCUMENTS

| | | |
|---|---|---|
| JP | 4-364679 | 12/1992 |
| JP | 6-273230 | 9/1994 |
| JP | 7-312720 | 11/1995 |
| JP | 10-318835 | 12/1998 |
| JP | 10-336526 | 12/1998 |

* cited by examiner

Primary Examiner—Marc S. Hoff
Assistant Examiner—Mary Catherine Baran
(74) Attorney, Agent, or Firm—Morgan, Lewis & Bockius LLP

(57) ABSTRACT

An electric signal current corresponding to the intensity of the incident light is output by a photodiode PD, electric charge is integrated in an integrating circuit 10 according to this electric signal current, and a signal voltage corresponding to this quantity of electric charge thus integrated is output. In a CDS circuit 20, the signal voltage output by the integrating circuit 10 is input to the capacitor $C_{21}$, and an electric charge corresponding to the amount of change in the input signal voltage is integrated in the capacitor $C_{22}$ or $C_{23}$ selected by switches SW21–SW23. In the differential calculating circuit 30, the differential in the electric charges integrated respectively by the capacitors $C_{22}$ and $C_{23}$ or the CDS circuit 20 is determined, and a signal voltage corresponding to this differential is output.

4 Claims, 9 Drawing Sheets

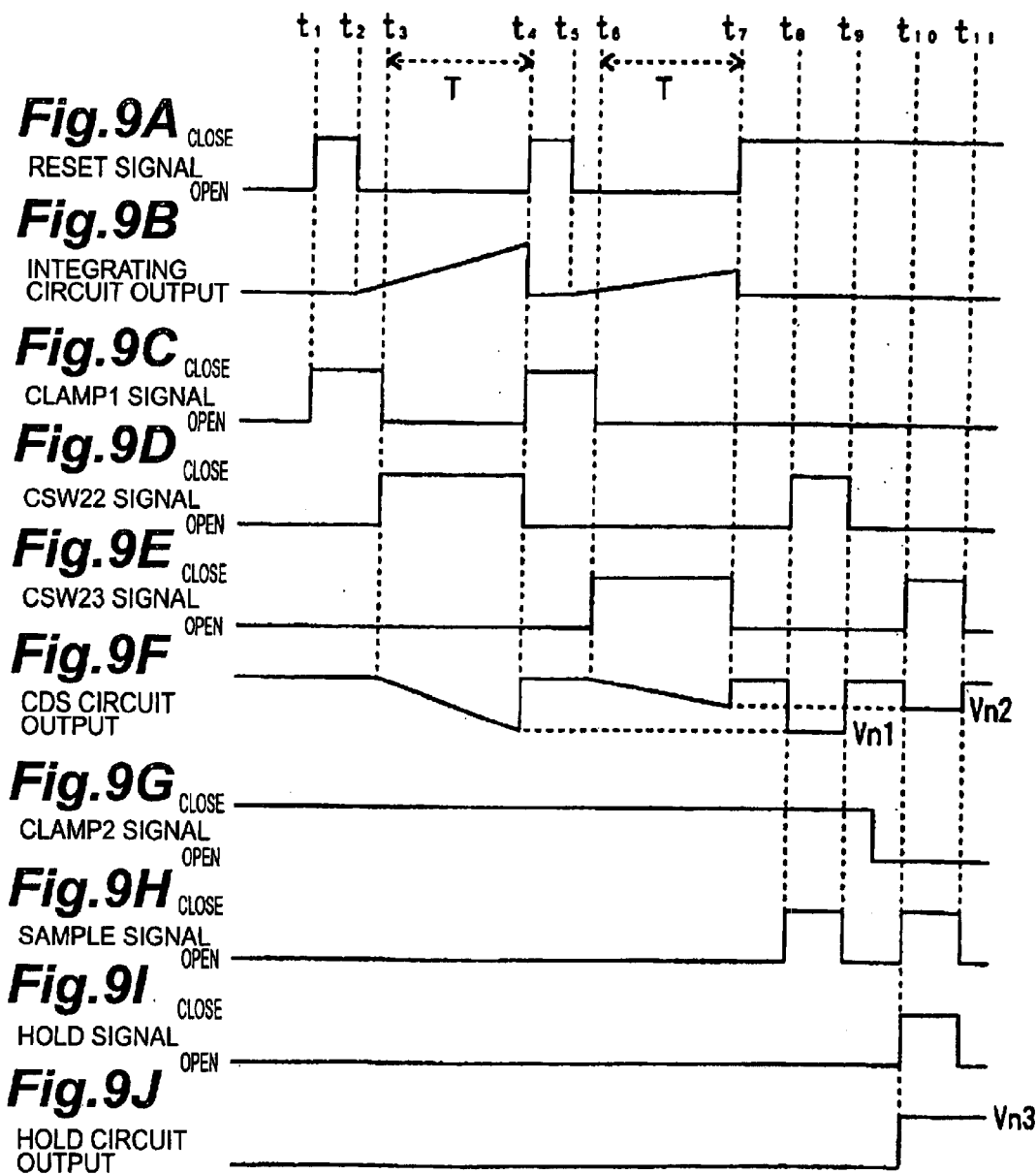

PHOTO-DETECTING APPARATUS

RELATED APPLICATION

This is a continuation-in-part application of application Ser. No. PCT/JP00/02789 filed on Apr. 27, 2000, now pending.

BACKGROUND OF THE INVENTION

1. Field of the Invention

The present invention relates to a photo-detecting apparatus for detecting only a signal light component by removing background light components from light input to a photodiode.

2. Related Background Art

A photo-detecting apparatus comprises one or more photodiodes, the electric signal current from each photodiode being integrated by an integrating circuit, and a signal voltage formed by the result of this integration being output. Furthermore, depending on the photo-detecting apparatus, the aforementioned signal voltage, which is an analogue signal, may be converted to a digital signal A/D conversion), and this digital signal is then output. If the signal voltage exceeds a prescribed value in this A/D conversion process, then the digital signal output by A/D conversion on the basis of this signal voltage will become saturated at a value corresponding to this prescribed value, and consequently, it will not be possible to perform accurate light detection. Therefore, in the prior art, saturation such as that described above has been prevented from occurring by setting the aforementioned prescribed value to the maximum predictable value of the aforementioned signal voltage, or a value thereabove. Furthermore, in some cases, the dynamic range is expanded by using a technique such as logarithmic compression, or the like.

Photo-detecting apparatuses are for example used in a range sensor incorporated into cameras. In a range sensor of this kind, the reflection of spot light beams projected onto an object by light projection means, such as a light-emitting diode, or the like, is detected respectively by two photo detecting apparatuses, and the distance is measured on the basis of the two detected signal outputs. In this case, since the intensity of the background light is also superimposed and detected when detecting the intensity of the spot light (signal light), then the accuracy of distance measurement can be improved by detecting only the intensity of the background light by means of the two respective photo-detecting apparatuses, whilst no spot light is being projected, and then detecting only the intensity of the spot light by taking the differential readings in either detector

SUMMARY OF THE INVENTION

However, in an integrating circuit used in a conventional photo-detecting apparatus, since no measures are taken with respect to noise components which have different values for each integrating operation, such as thermal noise generated by amplifiers, or the like, a noise error may arise. Therefore, if the light intensity detected by the photodiode, in other words, the value of the aforementioned signal voltage, is smaller than the noise component which varies for each integrating operation, then the S/N ratio in the optical detection will be low.

Furthermore, in A/D conversion in a conventional photo-detecting apparatus, the aforementioned prescribed value is set to a large value in order to prevent the signal level from becoming saturated, but if the light intensity detected by the photodiode, in other words, the value of the aforementioned signal voltage, is small, then the resolution of the digital signal output will be decreased.

Moreover, problems of the following kind arise if the intensity of the spot light is selectively detected by subtracting the detection results for the intensity of the background light from the detection results for intensity of the spot light and intensity of the background light, as in the case of a photo-detecting apparatus used as a range sensor.

Specifically, if the intensity of the background light is large compared to the intensity of the spot light, then the aforementioned signal voltage when the intensity of the spot light is detected with the intensity of the background light superimposed thereon will be very large, and hence, in order to prevent saturation of the signal occurring in this case, it is necessary to set the aforementioned prescribed value to an ever greater value. This causes further degradation of the resolution of the digital signal output on the basis of the intensity of the spot light obtained by the subtraction operation.

As described above, in a conventional photo-detecting apparatus, the S/N ratio is poor and the resolution of the digital signal output when A/D conversion is performed, is also poor. Therefore, the present invention was devised with the foregoing in view, an object thereof being to provide a photo-detecting apparatus having an excellent S/N ratio. Moreover, it is a further object of the invention to provide a photo-detecting apparatus which has excellent resolution when performing A/D conversion, even if the light intensity is small, without the signal becoming saturated when the light intensity is large.

The photo-detecting apparatus relating to the present invention comprises, (1) a photodiode for outputting an electric signal current corresponding to the intensity of the incident light; (2) an integrating circuit for integrating electric charge according to the electric signal current output by the photodiode and outputting a signal voltage corresponding to the electric charge thus integrated; (3) a CDS (Correlated Double Sampling) circuit having: a first capacitor and amplifier provided in sequence between an input terminal inputting the signal voltage output by the integrating circuit and an output terminal, a second capacitor and third capacitor having mutually equal capacitance values, provided in parallel between the input and output of the amplifier, and switching means for selecting either one of the second or third capacitors so as to integrate electric charge corresponding to the amount of change in the signal voltage; and (4) a differential calculating circuit for determining the differential between the electric charges integrated respectively in the second and the third capacitors of the CDS circuit, and outputting a signal voltage corresponding to this differential.

According to this photo-detecting apparatus, the electric signal current corresponding to the intensity of the incident light is output by the photodiode, and in the integrating circuit, electric charge is integrated according to the electric signal current output by the photodiode, and a signal voltage is output in accordance with the amount of electric charge thus integrated. In the CDS circuit, the electric charge signal output by the integrating circuit is input to the first capacitor, and an electric charge corresponding to the change in the signal voltage thus input is integrated in either the second or third capacitor as selected by the switches. Thereupon, in the differential calculating circuit, the differential in the electric charges integrated respectively by the second and third capacitors of the CDS circuits is determined and a signal voltage corresponding to this differential is output.

Furthermore, the photo-detecting apparatus according to the present invention is a photo-detecting apparatus further comprising a timing control circuit for controlling the respective operations of the integrating circuit, the CDS circuit and the differential calculating circuit, and the photo-detecting apparatus is used in conjunction with light projecting means for projecting spot light onto an object; wherein the timing control circuit causes: (1) a first electric charge to be integrated in the second capacitor of the CDS circuit on the basis of the amount of change of the signal voltage output by the integrating circuit, when the photodiode detects (receives) a spot light component and a background light component, in a first period wherein the spot light is projected onto the object by the light-emitting means; (2) a second electric charge to be integrated in the third capacitor of the CDS circuit on the basis of the amount of change in the signal voltage output by the integrating circuit when the photodiode detects (receives) the background light component, in a second period wherein the spot light is not projected onto the object by the light-emitting means; and (3) the differential between the electric charges integrated respectively by the second and the third capacitors of the CDS circuit to be calculated by the differential calculating circuit, in a third period after the first and the second periods, the signal voltage corresponding to this differential being output by the differential calculating circuit.

In this case, under the control of the timing control circuit, in the first period, a first electric charge corresponding to the change in the signal voltage output by the integrating circuit when the spot light component and background light component are detected by the photodiode is integrated in the second capacitor of the CDS circuit. Moreover, in the second period, a second electric charge corresponding to the change in the signal voltage output by the integrating circuit when the photodiode detects the background light component is integrated by the third capacitor of the CDS circuit. And during the third period, the differential between the electric charges integrated respectively in the second and third capacitors of the CDS circuit is determined by the differential calculating circuit, and a signal voltage corresponding to this differential is output by the differential calculating circuit. The signal voltage output by the differential calculating circuit corresponds to the spot light component. Either the first or the second periods may come prior to the other.

Moreover, the photo-detecting apparatus according to the present invention is characterized in that: (1) N sets (where N≧2) of the photodiode, the integrating circuit, the CDS circuit and the differential calculating circuit are provided; and (2) it further comprises: N hold circuits provided respectively with respect to the N differential calculating circuits, for holding and outputting the signal voltages output by the respective differential calculating circuits; and (3) an A/D converting circuit for successively inputting the signal voltages output respectively by the N hold circuits, converting the signal voltages to digital signals, and outputting the digital signals. In this case, N sets of a photodiode, integrating circuit, CDS circuit, differential calculating circuit and hold circuit are provided. A signal voltage output by the differential calculating circuit in each set is held by the hold circuit. Thereupon, the signal voltage output respectively by the N hold circuits are input successively to the A/D converting circuit, which converts these signal voltages to digital signals and then outputs the digital signals. In other words, a one-dimensional or two-dimensional image is captured, and this imagining result is output as a digital signal.

Moreover, the photo-detecting apparatus relating to the present invention is characterized in that it further comprises: a maximum value detecting circuit for detecting the maximum value of the signal voltages output respectively by the N differential calculating circuits or the N hold circuits; wherein the A/D converting circuit sets an A/D conversion range on the basis of the maximum value detected by the maximum value detecting circuit. In this case, the maximum value of the signal voltages output respectively by the N differential calculating circuits or hold circuits is detected by the maximum value detecting circuit. Thereupon, an A/D conversion range is set in the A/D converting circuit, on the basis of the maximum value detected by the maximum value detecting circuit.

BRIEF DESCRIPTION OF THE DRAWING

FIG. 9A, FIG. 9B, FIG. 9C, FIG. 9D, FIG. 9E, FIG. 9F, FIG. 9G, FIG. 9H, FIG. 9I, and FIG. 9J are timing charts for describing the operation of the photo-detecting apparatus relating to the present invention;

DESCRIPTION OF THE PREFERRED EMBODIMENT

Embodiments of the present invention are described below with reference to the drawings. In the description of the drawings, similar constituent elements are similarly labelled and repeated description thereof is omitted. Moreover, N is an integer of 2 or above, and the suffix n, unless specified otherwise, is any integer from 1 to N.

Figure 1:
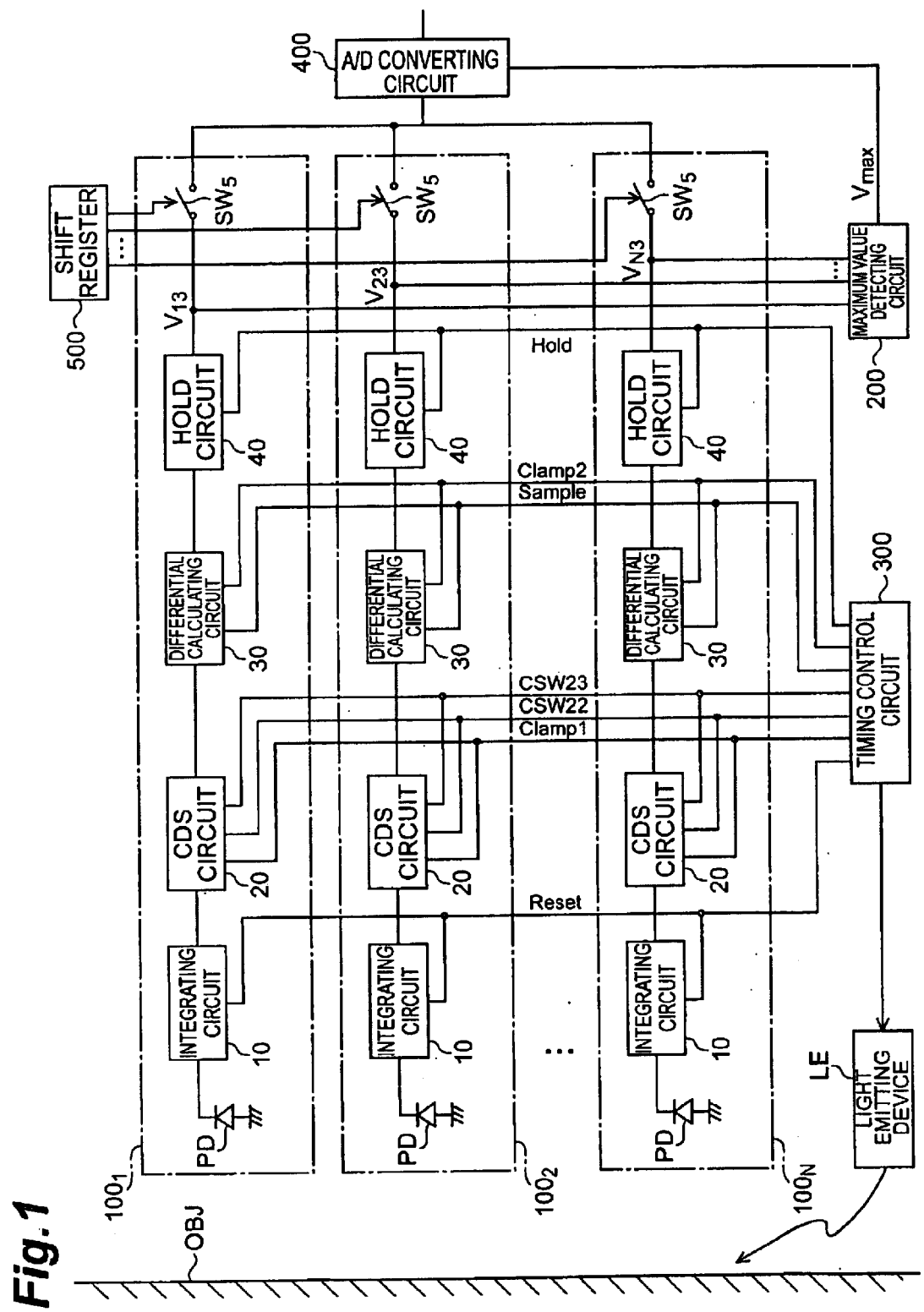
FIG. 1 is a general compositional view of a photo-detecting apparatus relating to an embodiment of the present invention.

Firstly, an embodiment of a photo-detecting apparatus relating to the present invention is described with reference to FIG. 1 to FIG. 8. FIG. 1 is a general compositional diagram of a photo-detecting apparatus relating to the present invention. The photo-detecting detecting apparatus relating to the present invention has N units $100_1$–$100_N$, a maximum value detecting circuit 200, timing control circuit 300, and A/D converting circuit 400, as well as a shift register 500, and light emitting device LE for irradiating light onto an object OBJ. The light emission timing of the light emitting device LE is controlled by the timing control circuit 300.

Each unit $100_n$ comprises a photodiode PD, integrating circuit 10, CDS circuit 20, differential calculating circuit 30, hold circuit 40, and switch $SW_5$. The integrating circuits 10 of each unit $100_n$ are of mutually similar composition, the CDS circuits 20 of each unit $100_n$ are of mutually similar composition, and the differential calculating circuits 30 of each unit $100_n$ are of mutually similar composition. Therefore, the N number of units $100_1$–$100_N$ each have a mutually similar composition.

The photodiode PD of each unit $100_n$ has an anode terminal connected to earth and a cathode terminal connected to the input terminal of an integrating circuit 10. The photodiode PD outputs an electric signal current corresponding to the intensity of the incident light thereby, from the anode terminal to the input terminal of the integrating circuit 10. The photodiodes PD of the respective units $100_n$ are arranged in a one-dimensional or two-dimensional configuration, and detect a one-dimensional image or two-dimensional image.

Figure 2:
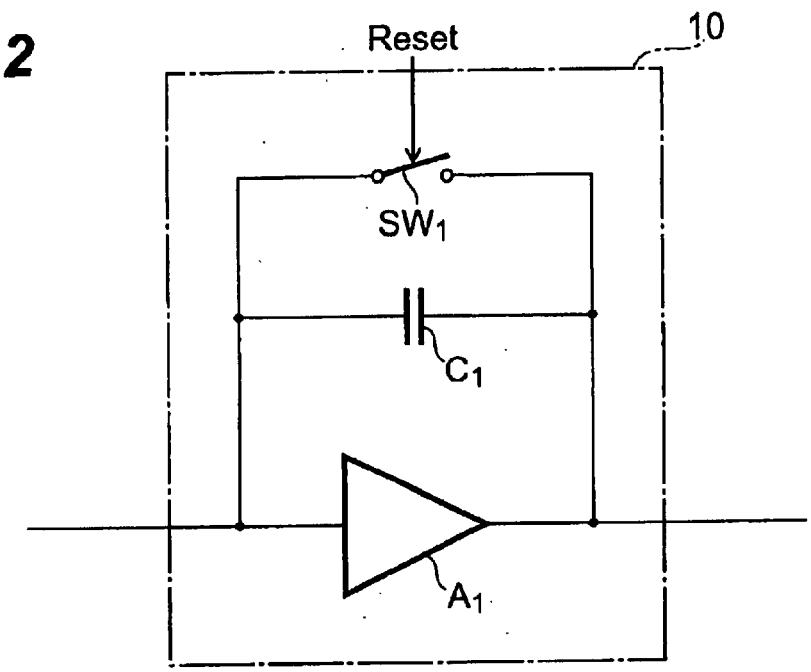
FIG. 2 is a circuit diagram of an integrating circuit of a photo-detecting apparatus relating to an embodiment of the present invention.

FIG. 2 is a circuit diagram of an integrating circuit 10 of a photo-detecting apparatus relating to the present invention. In the following description, unless specifically stated to the contrary, the signal is input to an inverse input terminal or an amplifier (operational amplifier), and the electric potential of the non-inverse input terminal is fixed. The integrating circuit 10 of each unit $100_n$ comprises an amplifier $A_1$, capacitor $C_1$, and switch $SW_1$, connected mutually in parallel with the input terminal and output terminal. The integrating circuit 10 is initiated when the switch $SW_1$ is closed and the capacitor $C_1$ is discharged. On the other hand, if the switch $SW_1$ is open in the integrating circuit 10, then the charge input from the photodiode PD to the input terminal integrates in the capacitor $C_1$ and a signal voltage corresponding to the integrated electrical charge is output from the output terminal. The switch $SW_1$ opens and closes on the basis of the Reset signal output from the timing control circuit 300.

Figure 3:
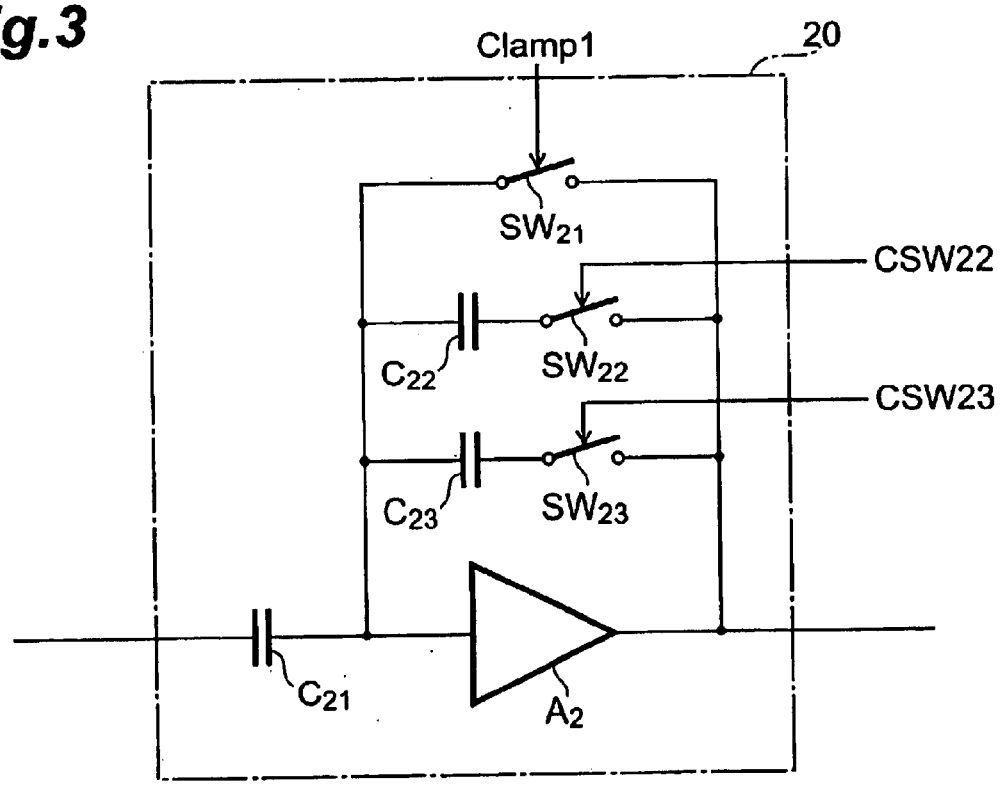
FIG. 3 is a circuit diagram of a CDS circuit of a photo-detecting apparatus relating to an embodiment of the present invention.

FIG. 3 is a circuit diagram of a CDS circuit 20 relating to the present invention. The CDS circuit 20 of each unit $100_n$ comprises a first capacitor $C_{21}$ and amplifier $A_2$ in series between the input terminal and output terminal. Furthermore, a switch $SW_{21}$, and a second capacitor $C_{22}$ and switch $SW_{22}$ mutually corrected in series, and a third capacitor $C_{23}$ and switch $SW_{23}$ mutually connected in series, are connected mutually in parallel between the input and output of the amp $A_2$. The capacitors $C_{22}$ and $C_{23}$ have respectively the same capacitance.

The CDS circuit 20 is initialized when the switches $SW_{21}$–$SW_{23}$ are closed and the capacitors $C_{22}$ and $C_{23}$ are respectively discharged. If the switches $SW_{21}$ and $SW_{23}$ are open and the switch $SW_{22}$ is closed, then a first charge input from the input terminal via the capacitor $C_{21}$ integrates in the capacitor $C_{22}$, and a signal voltage corresponding to this integrated electric charge is output from the output terminal. If the switches $SW_{21}$ and $SW_{22}$ are open and the switch $SW_{23}$ is closed, then a second charge input from the input terminal via the capacitor $C_{21}$ will integrate in the capacitor $C_{23}$, and a signal voltage corresponding to the integrated charge will be output from the output terminal. The switch $SW_{21}$ opens and closes on the basis of a Clamp1 signal output by the timing control circuit 300. The switch $SW_{22}$ opens and closes on the basis of a $CSW_{22}$ signal output by the timing control circuit 300. Moreover, the switch $SW_{23}$ opens and closes on the basis of a $CSW_{23}$ signal output by the timing control circuit 300.

Figure 4:
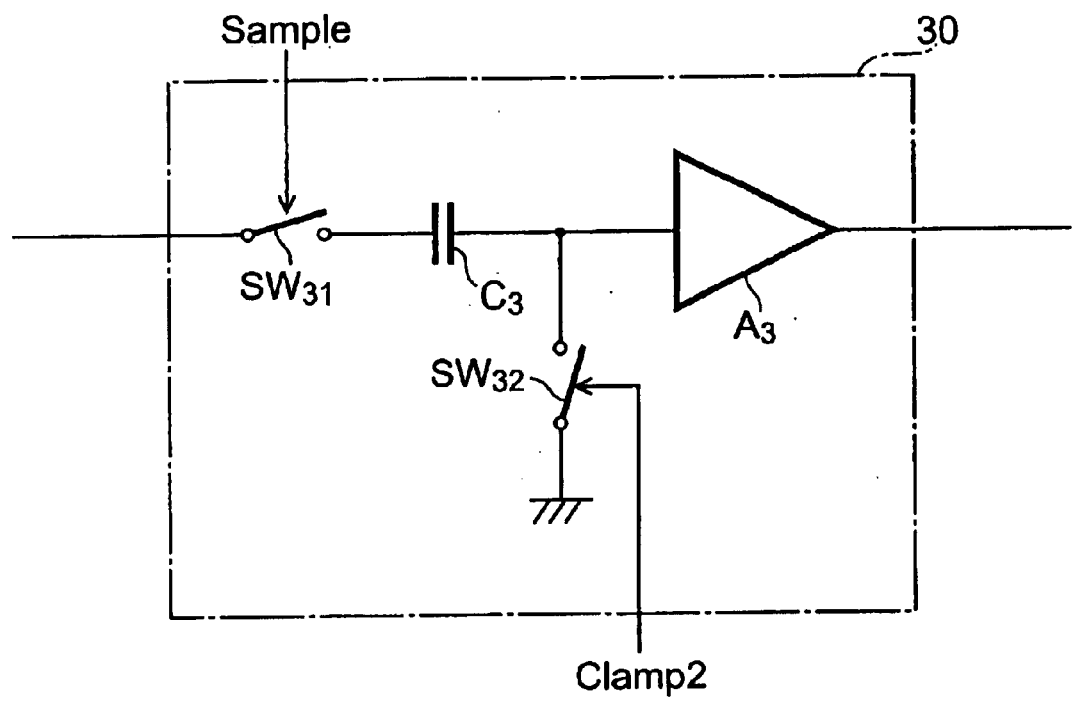
FIG. 4 is a circuit diagram of a differential calculating circuit of a photo-detecting apparatus relating to an embodiment of the present invention.

FIG. 4 is a circuit diagram of a differential calculating circuit 30 of a photo-detecting apparatus relating to the present invention. The differential calculating circuit 30 in each unit $100n$ comprises a switch $SW_{31}$, capacitor $C_3$ and amp $A_3$, the contact point between the capacitor $C_3$ and the amp $A_3$ being earthed via a switch $SW_{32}$. In this differential calculating circuit 30, when the switch $SW_{32}$ is closed, the capacitor $C_3$ is charged to electric charge Q1 by closing the switch $SW_{31}$ for a fixed period of time, and when the switch $SW_{32}$ is open, electric charge Q2 is released from the capacitor $C_3$ by closing the switch $SW_{31}$ for a fixed period of time, whereby, the differential between electric charge Q1 and electric charge Q2, in other words, charge (Q1–Q2) is integrated in the capacitor $C_3$, and a signal voltage corresponding to this integrated charge (Q1–Q2) is output from the amp $A_3$. The switch SW31 opens and closes on the basis of a Sample signal output by the timing control circuit 300. Moreover, the switch $SW_{32}$ is opened and closed by a Clamp2 signal output by the timing control circuit 300.

Figure 5:
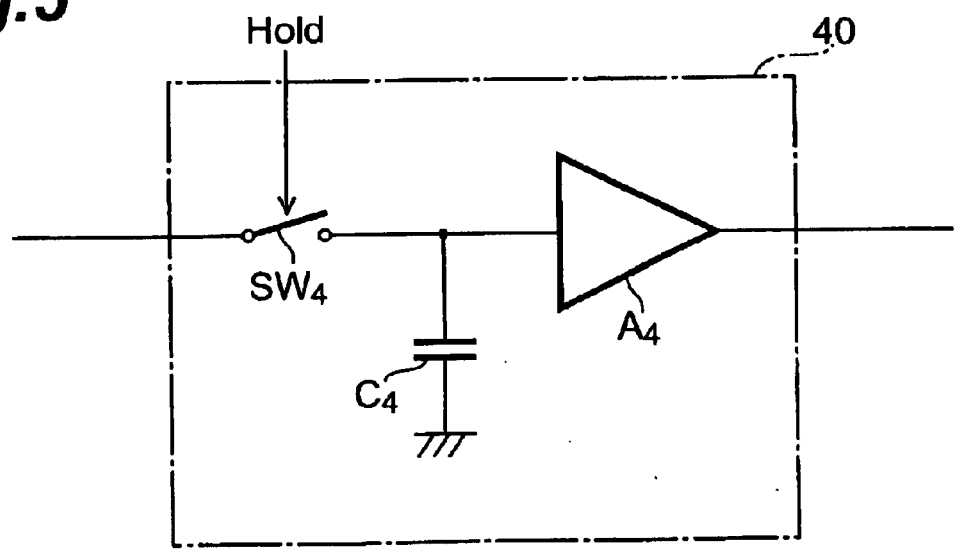
FIG. 5 is a circuit diagram of a hold circuit of a photo-detecting apparatus relating to an embodiment of the present invention.

FIG. 5 is a circuit diagram of a hold circuit 40 of a photo-detecting apparatus relating to the present invention. The hold circuit 40 of each unit $100_n$ comprises a switch $SW_4$ and amp $A_4$ in series between an input terminal and output terminal, the contact point of the switch $SW_4$ and amp $A_4$ being connected to earth via a capacitor $C_4$. The hold circuit 40 stores the signal voltage output by the differential calculating circuit 30 in the capacitor $C_4$, when the switch $SW_4$ is closed, and even after the switch $SW_4$ has been opened, it holds the signal voltage in capacitor $C_4$, and this signal voltage is output via the amp $A_4$. The switch $SW_4$ opens and closes on the basis of a Hold signal output from the timing control circuit 300. The switches $SW_5$ of each unit $100_n$ is controlled by a shift register 500 and open successively, the signal voltage output by the hold circuit 40 being input successively to the A/D converting circuit 400.

Figure 6:
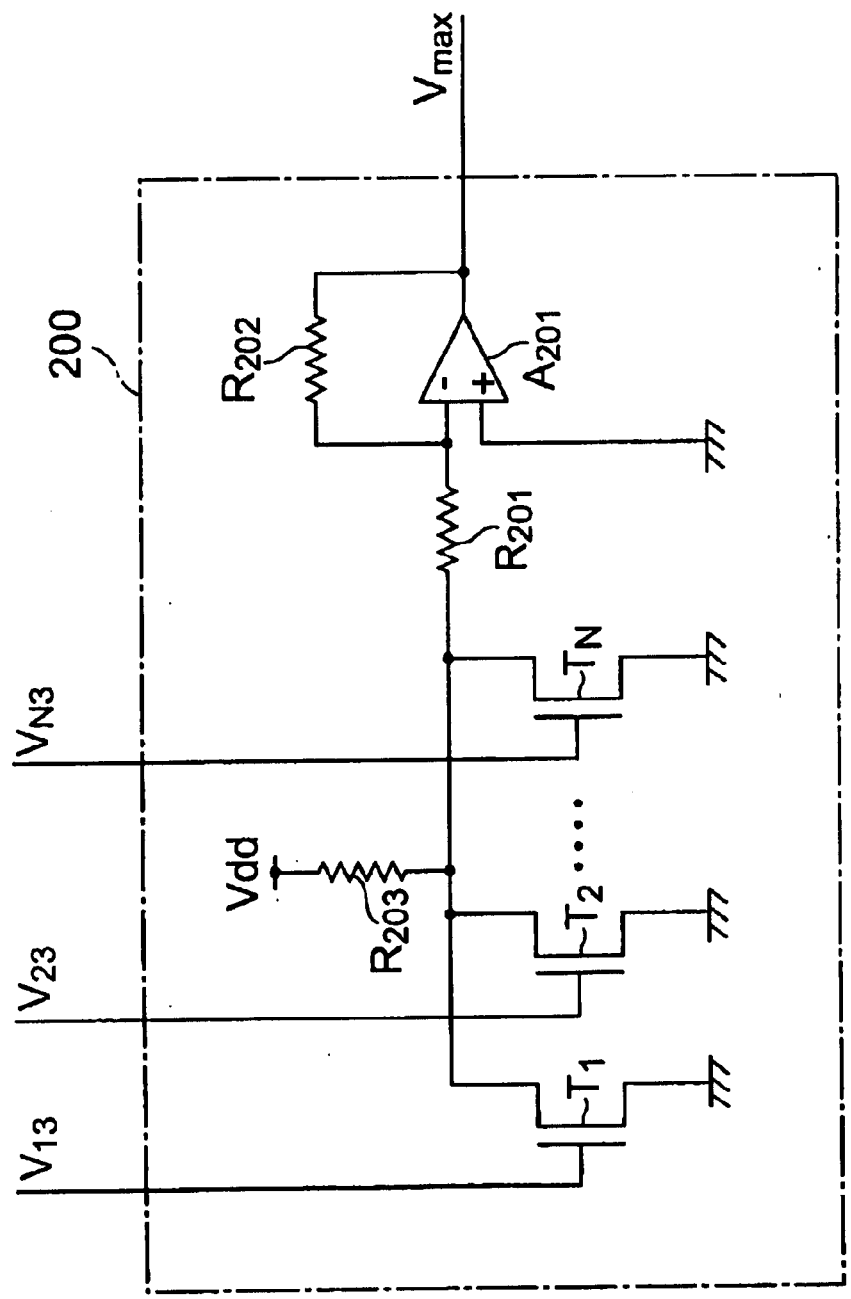
FIG. 6 is a circuit diagram of a maximum value detecting circuit of a photo-detecting apparatus relating to an embodiment of the present invention.

FIG. 6 is a circuit diagram of a maximum value detecting circuit 200 relating to the present embodiment. This maximum value detecting circuit 200, comprises NMOS transistors $T_1$–$T_N$, resistors $R_{201}$–$R_{203}$, and differential amp $A_{201}$. The source terminal of each transistor $T_n$ is earthed, and the drain terminal of each transistor $T_n$ is connected to a supply voltage Vdd, whilst also being connected to the inverse input terminal of differential amplifier $A_{201}$, via resistor $R_{201}$. The gate terminal of each transistor $T_n$ is connected to the output terminal of the hold circuit 40 of the unit $100_n$, and a signal voltage $V_{n3}$ output form the hold circuit 40 is input thereto. Moreover, a feedback resistor $R_{203}$ is provided between the inverse input terminal and output terminal of the differential amp $A_{201}$, whilst the non-inverse input terminal of the differential amp $A_{201}$ is earthed. In this maximum value detecting circuit 200, the signal voltage $V_{n3}$ output from the hold circuit 40 of each unit $100_n$ is input to the gate terminal of the transistor Tn, and an electric potential corresponding to the maximum value of each signal voltage $V_{n3}$ appears at the drain terminal of the transistor $T_n$. This electric potential at the drain terminal is amplified by differential amplifier $A_{201}$, by an amplification rate corresponding to the ratio of the respective resistance values of resistors $R_{201}$ and $R_{202}$, and this amplified voltage value is output to the A/D converting circuit 400, from the output terminal.

Figure 7:
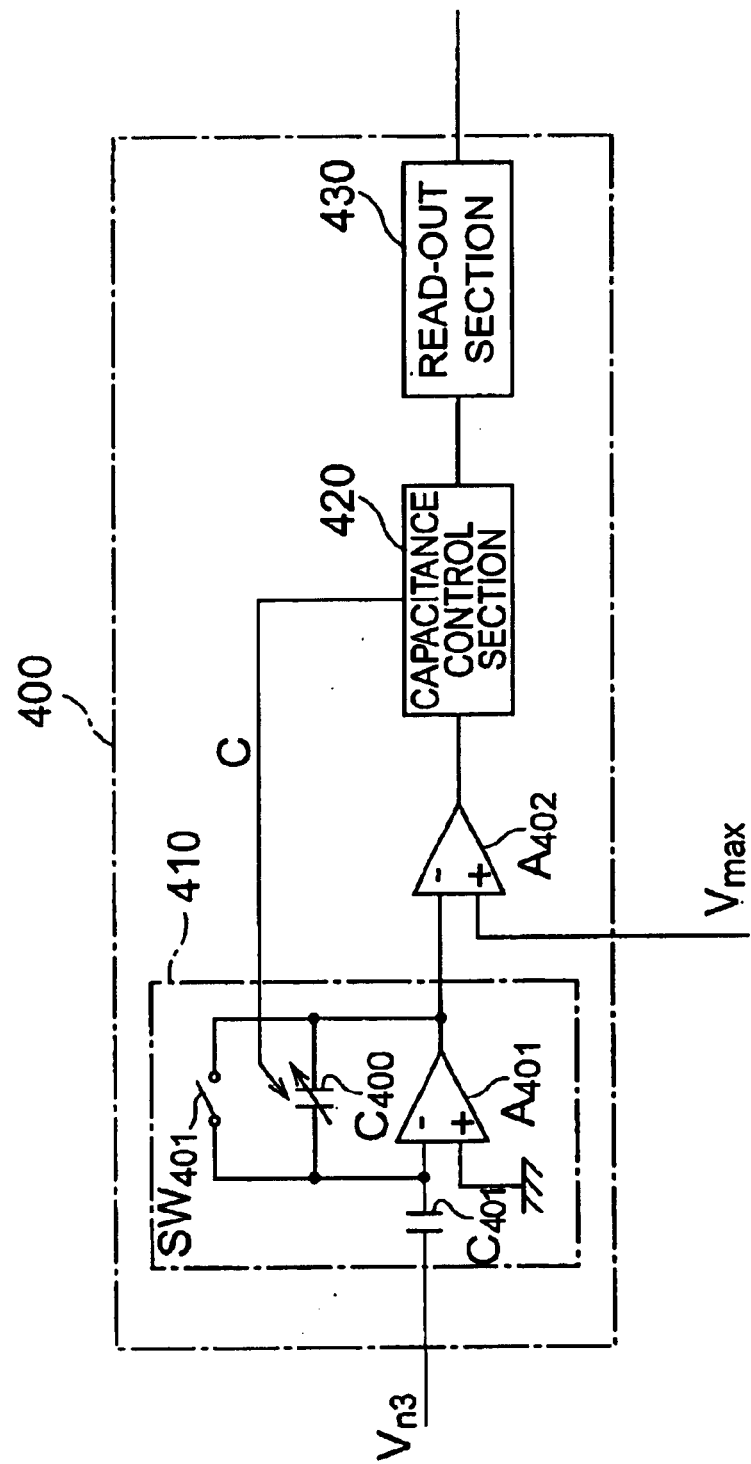
FIG. 7 is a circuit diagram of an A/D converting circuit of a photo-detecting apparatus relating to an embodiment of the present invention.

FIG. 7 is a circuit diagram of an A/D converting circuit 400 of a photo-detecting apparatus relating to the present invention. This A/D converting circuit 400 inputs a maximum voltage value $V_{max}$ output by the maximum value detecting circuit 200, and performs A/D conversion of this maximum voltage value. The A/D converting circuit 400 also successively inputs a signal voltage $V_{n3}$ output from the hold circuit 40 of each unit 100$_n$, via switch SW$_5$, and converts this signal voltage (analogue signal) to a digital signal. The A/D converting circuit 400 comprises a variable-capacity integrating circuit 410, comparing circuit A$_{402}$, capacitance control section 420 and read-out section 430.

The variable capacitance integrating circuit 410 comprises a capacitor C$_{401}$, amp A$_{401}$, variable capacitor section C$_{400}$, and a switch SW$_{401}$. The amp A$_{401}$ inputs the signal voltages $V_{n3}$ output by the hold circuit 40 of the respective units 100$_n$ and successively received via the switch SW$_5$, to the inverse input terminal, by means of the capacitor C$_{401}$. The noninverse input terminal of the amp A$_{401}$ is connected to earth. The variable capacitor section C$_{400}$ is controllable and has variable capacitance, and it is provided between the inverse input terminal and output terminal of the amp A$_{401}$ and integrates electrical charge according to the input signal voltage. Switch SW$_{401}$ is provided between the inverse input terminal and output terminal of the amp A$_{401}$, and when it is open, electrical charge integrates in the variable capacitor section C$_{400}$, whereas when it is closed, the electrical charge integrated in the variable capacitor section C$_{400}$ is reset. The variable capacitance integrating section 410 inputs the signal voltages $V_{n3}$ output successively by the respective units 100$_n$, integrates them according to the capacitance of the variable capacitor section C$_{400}$, and outputs an integration signal resulting from this integration process.

Comparing circuit A$_{402}$ inputs the integration signal output from variable capacitance integrating section 410 to an inverse input terminal, and inputs the maximum voltage value $V_{max}$ output by the maximum value detecting circuit 200, to a non-inverse input terminal, comparing the magnitude of these two input signals and outputting a comparing result signal accordingly.

The capacitance control section 420 inputs the comparison result signal output by comparing circuit A$_{402}$ and outputs a capacitance instruction signal C for controlling the capacitance of the variable capacitor section C$_{400}$, on the basis of the received comparison result signal, whilst also outputting a first digital signal corresponding to the capacitance value or the variable capacitor section C$_{400}$, if it is judged on the basis of the comparison result signal that the value of the integration signal and the maximum voltage value $V_{max}$ are matching, within a prescribed resolution.

The read-out section 430 inputs the first digital signal output by the capacitance control section 420 and outputs a second digital signal corresponding to this first digital signal. The second digital signal represents a value obtained by subtracting an offset value for the variable capacitance integrating circuit 410 from the first digital signal. The read-out section 430 is, for example, a memory element, which inputs the first digital signal as an address, and outputs data scored at that address of the memory element, as the second digital signal. This second digital signal forms the optical detection signal output by the photo-detecting apparatus relating to the present invention.

Figure 8:
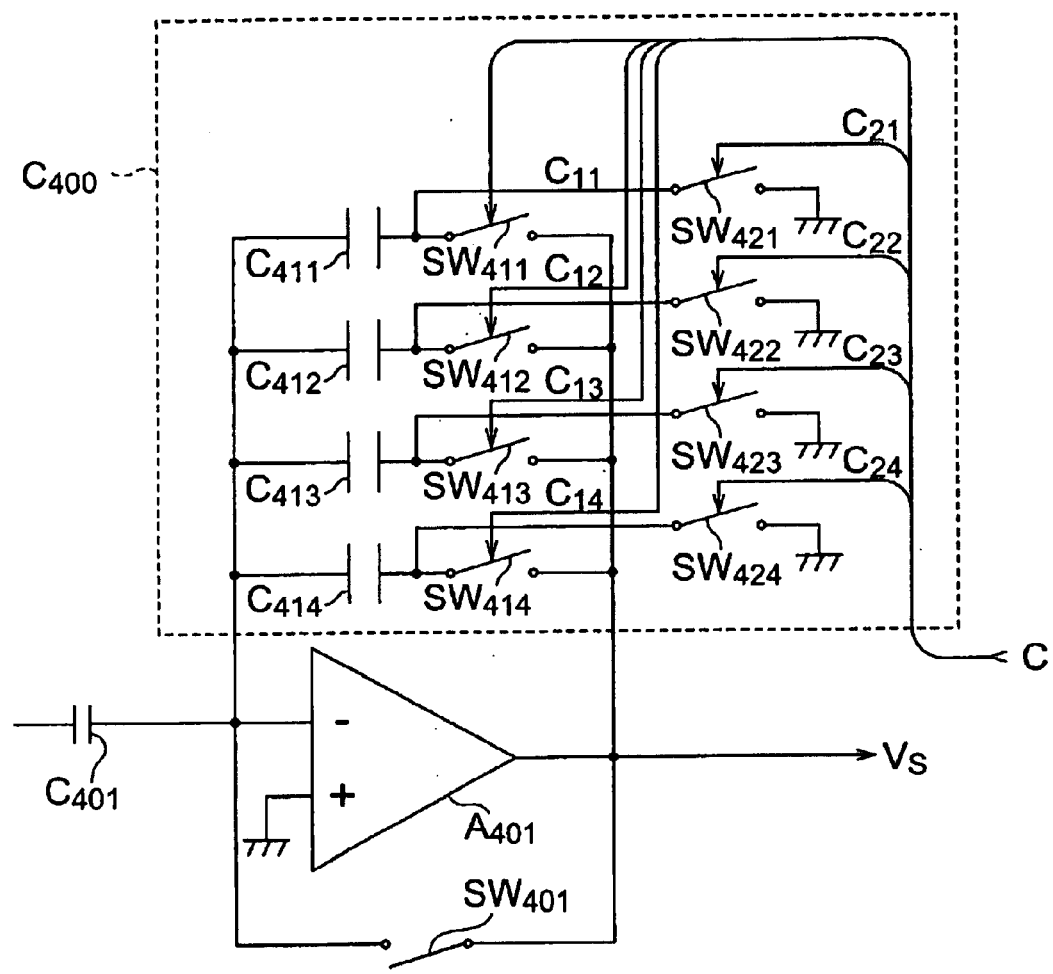
FIG. 8 is a detailed circuit diagram of a variable capacitance integrating circuit in an A/D converting circuit.

FIG. 8 is a detailed circuit diagram of the variable capacitance integrating circuit 410 in the A/D converting circuit 400. In this diagram, a circuit composition comprising an A/D converting function having $\frac{1}{2^4}=\frac{1}{16}$ resolution is illustrated, and this circuit composition is described below.

As shown in this diagram, the variable capacitor section C$_{400}$ comprises capacitors C$_{411}$–C$_{414}$, switches SW$_{411}$–SW$_{414}$, and switches SW$_{421}$–SW$_{424}$. The capacitor C$_{411}$ and switch SW$_{411}$ are mutually connected in series, and are provided between the inverse input terminal and output terminal of the amp A$_{401}$. The switch SW$_{421}$ is provided between the contact point of the capacitor C$_{411}$ and switch SW$_{411}$, and an earth potential. The capacitor C$_{412}$ and switch SW$_{412}$ are mutually connected in series and are provided between the inverse input terminal and output terminal of amp A$_{401}$. The switch SW$_{422}$ is provided between the contact point of the capacitor C$_{412}$ and switch SW$_{412}$, and an earth potential. The capacitor C$_{413}$ and switch SW$_{413}$ are mutually connected in series and are provided between the inverse input terminal and output terminal of amp A$_{401}$. The switch SW$_{421}$ is provided between the contact point of the capacitor C$_{413}$ and switch SW$_{413}$, and an earth potential. Moreover, The capacitor C$_{414}$ and switch SW$_{414}$ are mutually connected in series and are provided between the inverse input terminal and output terminal of amp A$_{401}$. The switch SW$_{424}$ is provided between the contact point of the capacitor C$_{414}$ and switch SW$_{414}$, and an earth potential.

The respective switches SW$_{411}$–SW$_{414}$ are opened and closed on the basis of C11–C14 of the capacitance instruction signals C output by the capacitance control section 420. The respective switches SW$_{421}$–SW$_{424}$ are opened and closed on the basis of C21–C24 of the capacitance instruction signals C output by the capacitance control section 420. Moreover, taking the capacitance values of the capacitors C$_{411}$–C$_{414}$ as C$_{411}$–C$_{414}$, these values satisfy the relationships $$C_{411}=2C_{412}=4C_{413}=8C_{414} \quad (1)$$

$$C_{411}+C_{412}+C_{413}+C_{414}=C_0 \quad (2)$$

Next, the operation of the photo-detecting apparatus relating to the present invention will be described. FIG. 9A, FIG. 9B, FIG. 9C, FIG. 9D, FIG. 9E, FIG. 9F, FIG. 9G, FIG. 9H, FIG. 9I, FIG. 9J are timing chart for describing the operation of a photo-detecting apparatus relating to the present invention. FIG. 9A illustrates a timing chart of a reset signal, FIG. 9B, of an integrating circuit output, FIG. 9C, of a Clamp1 signal, FIG. 9D, of a CSW22 signal, FIG. 9E, of a CSW23 signal, FIG. 9F, of a CDS circuit output, FIG. 9G, of a Clamp2 signal, FIG. 9H, of a Sample signal, FIG. 9I, of a Hold signal, and FIG. 9J, of a hold circuit output, respectively.

Below, a case is described where the photo-detecting apparatus relating to the present invention constitutes a light-emitting device (light-emitting means) LE, such as a light-emitting diode, or the like, and additionally, an active range sensing device. In other words, the operation described below involves subtracting the background light component, and outputting an optical detection signal only for the spot light component (signal light component) projected onto the object OBJ by the light emitting device LE, such as a light-emitting diode, or the like.

At timing $t_1$, by means of the Reset signal assuming logic H, the switch SW$_1$ of the integrating circuit 10 closes, the capacitor C$_1$ is discharged and the circuit is thus initialized. Furthermore, by the Clamp1 signal assuming logic H, the switch SW$_{21}$ of the CDS circuit 20 closes and the CDS operation in the CDS circuit 20 is halted.

At timing $t_2$, the reset signal assumes logic L, and therefore the switch SW$_1$ of the integrating circuit 10 opens. From timing $t_2$ onwards, electric charge output from the photodiode PD integrates progressively in the capacitor C$_1$, and the signal voltage output from the output terminal of the integrating circuit 10 becomes progressively larger. At timing $L_2$, the Clamp1 signal remains at logic H, and the switch $SW_{21}$ of the CDS circuit 20 remains closed. Moreover, at timing $t_2$, the $CSW_{22}$ signal and $CSW_{23}$ signal are respectively at logic L, and hence the switches $SW_{22}$ and $SW_{23}$ of the CDS circuit 20 are both open.

At timing $t_3$, by means of the Clamp1 signal assuming logic L, the switch $SW_{21}$ of the CDS circuit 20 opens, and by CSW22 signal assuming logic H, the switch $SW_{22}$ of the CDS circuit 20 closes. Thereupon, from timing $t_3$ until $t_4$ after a prescribed period of time T has elapsed, Clamp1 signal assumes logic H, and hence the switch $SW_{21}$ of the CDS circuit 20 closes, whilst the CSW22 signal assumes logic L and hence the switch $SW_{22}$ of the CDS circuit 20 opens.

In the period between timings $t_2$ and $t_4$, spot light is projected from the light-emitting diode LE onto the object OBJ. Consequently, both the spot light projected by the light-emitting diode LE and reflected back by the object OBJ are incident at the photodiode PD, and an electric signal current generated thereby is output by the photodiode PD. In the integrating circuit 10 inputting this electric signal current, electric charge is integrated in capacitor $C_1$, and a signal voltage corresponding to the amount of electric charge thus integrated is output by the integrating circuit 10. Moreover, in the period between timings $t_3$ and $t_4$ (first period), a signal voltage output from the output terminal of the integrating circuit 10 is input to the CDS circuit 20, electric charge corresponding to the charge in the input signal voltage after timing $t_3$ is integrated, and a signal voltage corresponding to the quantity of electric charge thus integrated is output from the CDS circuit 20. Therefore, the signal voltage output by the CDS circuit 20 at timing $t_4$ is a voltage value Vn1 corresponding to the difference between the signal voltages output by the integrating circuit 10 at timing $t_3$ and timing $t_4$, respectively, and it is a signal voltage from which the noise component generated by the integrating circuit 10 has been removed.

At timing $t_4$, by means of the Reset signal assuming logic H, the switch $SW_1$ of the integrating circuit 10 closes, the capacitor $C_1$ is discharged, and the circuit is thus initialized. Furthermore, since the Clamp1 signal also assumes logic H, the switch $SW_{21}$ of the CDS circuit 20 closes and the CDS operation in the CDS circuit 20 is halted.

At timing $t_s$, the Reset signal assumes logic L and hence the switch $SW_1$ of the integrating circuit 10 opens. From timing $t_s$ onwards, the electric charge output from the photodiode PD is progressively integrated in the capacitor $C_1$, and the signal voltage output from the output terminal of the integrating circuit 10 progressively becomes larger. At timing $t_s$, the Clamp1 signal remains at logic H, and the switch $SW_{21}$ of the CDS circuit 20 remains closed. Moreover, at timing $t_s$, the CSW22 signal and CSW23 signal are respectively at logic L, and hence both switch $SW_{22}$ and switch $SW_{23}$ of the CDS circuit 20 are open.

At timing $t_6$, by means of the Clamp1 signal assuming logic L, the switch $SW_{21}$, of the CDS circuit 20 opens, and by means of the CSW23 signal assuming logic H, the switch, $SW_{23}$ of the CDS circuit 20 closes.

In the period between timings $t_b$ and $t_7$, no spot light is projected onto the object OBJ from the light-emitting diode LE. Therefore, only the background light component is incident on the photodiode PD, the electric signal current generated thereby being output from the photodiode PD. In the integrating circuit 10 inputting this electric signal current, the electric charge is integrated in the capacitor $C_1$, and a signal voltage corresponding to the quantity of electric charge thus integrated is output by the integrating circuit 10.

Moreover, in the period between timing $t_6$ and $t_7$ (second period), the signal voltage output from the output terminal of the integrating circuit 10 is input to the CDS circuit 20, and an electric charge corresponding to the change in the input signal voltage after timing $t_6$ is integrated in the capacitor $C_{23}$, and a signal voltage corresponding to this integrated amount of electric charge is output by the CDS circuit 20. Consequently, the signal voltage output by the CDS circuit 20 at timing $t_7$ is a voltage value $V_{n2}$ corresponding to the difference between the signal voltages output by the integrating circuit 10 at timing $t_6$ and timing $t_7$, respectively, and this signal voltage has the noise component generated by the integrating circuit 10 removed therefrom.

From timing $t_2$ onwards, the electric charge integrated in the capacitor $C_{22}$ of the CDS circuit 20 corresponds to the sum of the spot light component and the background light component, and the electric charge integrated in the capacitor $C_{23}$ of the CDS circuit 20 corresponds to the background light component only. Moreover, since the period between timings $t_3$ and $t_4$ (first period) and the period between timings $t_6$ and $t_7$ (second period) are mutually equal time periods T, and since the respective capacitors $C_{22}$ and $C_{22}$ have mutually the same capacitance, the voltage value $V_{n1}$ corresponds to the sum of the spot light component and the background light component, whilst the voltage value $V_{n2}$ corresponds to the background light component only, and consequently, the voltage differential between the two $\Delta V_n = (V_{n1} - V_{n2})$ corresponds to the spot light component only. Therefore, from timing $t_8$ onwards, this voltage differential $\Delta V_n$ is determined in the following manner by the differential calculating circuit 30.

From timing $t_7$ onwards (third period), the Reset signal assumes logic H, and the switch $SW_1$ of the integrating circuit 10 closes, whereby the capacitor $C_1$ is discharged and the circuit maintains an initialized state. Moreover, the Clamp1 signal is at logic L and the switch $SW_{21}$ of the CDS circuit 20 remains open.

In the period between timing $t_6$ and timing $t_9$, the CSW22 signal has logic H, and the switch $SW_{22}$ of the CDS circuit 20 is closed. The Sample signal assumes logic H, and the switch $SW_{31}$ of the differential calculating circuit 30 is closed. Here, the Clamp2 signal is at logic H, and the switch $SW_{32}$ of the differential calculating circuit 30 is closed. The signal voltage output from the output terminal of the CDS circuit 20 during this period is a voltage value $V_{n1}$ corresponding to the quantity of electric charge integrated in the capacitor $C_{22}$, and this voltage value $V_{n1}$ is held in the capacitor $C_3$ of the differential calculating circuit 30.

In the period from timing the $t_{10}$ timing t11, signal CSW23 has logic H and the switch $SW_{23}$ of the CDS circuit 20 is closed. The Sample signal has logic H, and the switch $SW_{31}$ of the differential calculating circuit 30 is closed. Here, the Clamp2 signal is at logic L, and the switch $SW_{32}$ of the differential calculating circuit 30 is open. In this period, the signal voltage output from the output terminal of the CDS circuit 20 is a voltage value $V_{n2}$ corresponding to the quantity of electric charge integrated in the capacitor $C_{23}$. In this case, since the switch $SW_{32}$ of the differential calculating circuit 30 is open, the difference $\Delta V_n$ between the voltage value $V_{n2}$ and the voltage value $V_{n1}$ is held in the capacitor $C_3$ of the differential calculating circuit 30. This voltage value $\Delta V_n$ corresponds to the spot light component only.

Moreover, the Hold signal assumes logic H, thereby closing the switch $SW_4$ of the hold circuit 40, and hence the voltage value $\Delta V_n$ held in the capacitor $C_3$ of the differential calculating circuit 30 passes via the amp $A_3$ of the differential calculating circuit 30 and the switch $SW_4$ of the hold circuit 40, and is held in capacitor $C_4$ of the hold circuit 40. At timing $t_{11}$, the Hold signal assumes logic L, and after the switch $SW_4$ has opened, the voltage value $\Delta V_n$ held in the capacitor $C_4$ of the hold circuit 40 is output from the amp $A_4$ as signal voltage $Vn_3$.

The signal voltages $V_{n3}$ output from the hold circuits 40 of each of the respective units $100_n$ are input to the maximum value detecting circuit 200, which detects the maximum voltage value $V_{max}$. Furthermore, the switch $SW_5$ of each unit $100_n$ is successively closed by the shift register 500, and the signal voltage $V_{n3}$ from, the hold circuit 40 of each unit $100_n$ is input successively to the A/D converting circuit 400.

As described above, the present device comprises photoelectric converting elements PD for outputting an electrical signal corresponding to incident light, two capacitors C22, C23 interposed in parallel between the inverse input terminal and output terminal of an operational amplifier A2 and connected selectively between the aforementioned input and output terminals, and an amplifier circuit A3 for amplifying the output of the operating amplifier A2, the output signal from the photoelectric converting element PD when light is incident being input to the aforementioned inverse input terminal when one of the capacitors C22, C23 is connected, and the output signal from the photoelectric converting element PD when no light is incident being input to the same terminal when the other of the capacitors C22, C23 is connected.

The operation of the A/D converting circuit 400 is described next with reference to FIG. 10A to FIG. 10D. At timing $t_{11}$, the switch $SW_{401}$ of the variable capacitance integrating circuit 410 closes and the variable capacitance integrating circuit 410 assumes a reset state. Moreover, the switches $SW_{411}$–$SW_{414}$ of the variable capacitance integrating circuit 410 are each closed, and the switches $SW_{421}$–$SW_{424}$ are each open, the capacitance value of the variable capacitor section $C_{400}$ being set to $C_0$.

At a certain timing after timing $t_{11}$, the switch $SW_{401}$ of the A/D converting circuit 400 opens, and the switch $SW_5$ of the first unit $100_1$ closes. The signal voltage $V_{13}$ output by the hold circuit 40 of the unit $100_1$ is input to the variable capacitance integrating circuit 410 of the A/D converting circuit 400, via the switch $SW_5$. When the signal voltage V13 is input to the capacitor C401 of the variable capacitance integrating circuit 410, an electric charge O corresponding to the value of this signal voltage $V_{13}$, and the capacitance value $C_0$ of the variable capacitor section $C_{400}$ flows into the variable capacitor section $C_{400}$ (see FIG. 10A). In this case, the value of the integration signal output by the variable capacitance integrating circuit 410, $V_{sa}$ is expressed by the equation:

$$V_{sa}-V_{13}=Q/C_0 \tag{3}$$

Figure 10A:
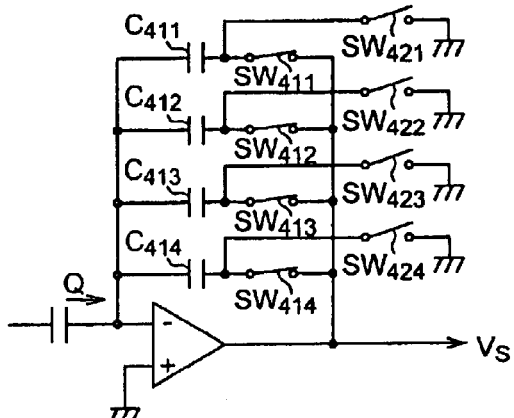
FIG. 10A, FIG. 10B, FIG. 10C and FIG. 10D are circuit diagrams for describing the operation of an A/D converting circuit.
Figure 10B:
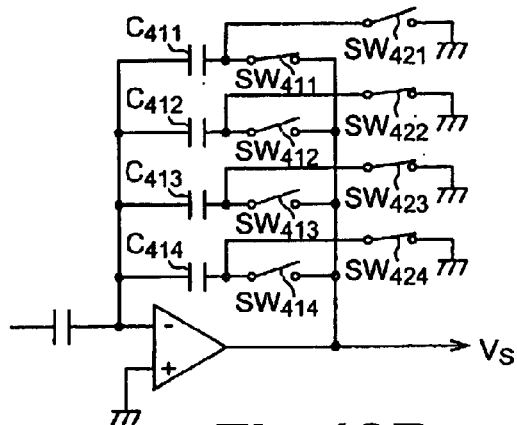

Subsequently, the capacitance control section 420 opens the switches $SW_{412}$–$SW_{414}$ of the variable capacitor section $C_{400}$ and then closes the switches $SW_{422}$–$SW_{424}$ (see FIG. 10B). As a result of this, the capacitance value of the variable capacitor section $C_{400}$ becomes $C_{411}$, and the value $V_{sb}$ of the integration signal output by the variable capacitor integrating circuit 410 becomes as follows.

$$V_{sb}-Q/C_{411} \tag{4}$$

This integration signal is input to the comparing circuit $A_{402}$, which compares the value thereof in size with the maximum voltage value $V_{max}$.

Figure 10C:
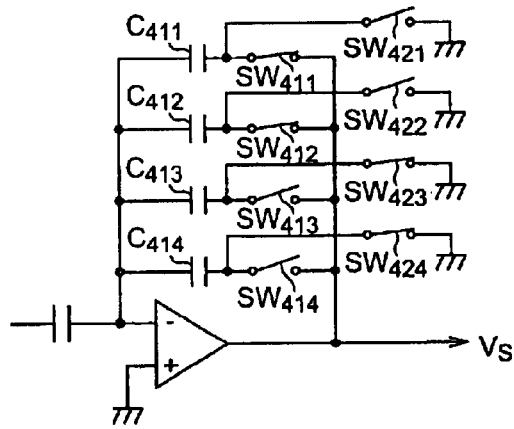

If $V_{st}>V_{max}$, then on receiving this comparison result, the capacitance control section 420 also opens switch $SW_{422}$ of the variable capacitor section C400 and then closes switch $SW_{412}$ (see FIG. 10C). Accordingly, the capacitance value of the variable capacitor section $C_{400}$ becomes $C_{411}+C_{412}$, and the value of the integration signal output from the variable capacitance integrating circuit 410, $V_{sc}$, becomes $$V_{sc}=Q/(C_{411}+C_{112}) \tag{5}$$

This integration signal is input to the comparing circuit $A_{402}$ and the value thereof is compared in size to the maximum voltage value $V_{max}$.

Figure 10D:
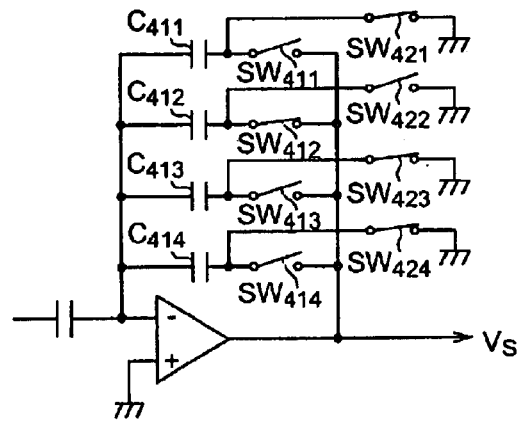

Furthermore, if $V_{ab}<V_{max}$, then upon receiving this comparison result, the capacitance control section 420 also opens switches $SW_{411}$ and $SW_{422}$ of the variable capacitor section $C_{400}$, whereupon it closes switches $SW_{412}$ and $SW_{421}$ (see FIG. 10D). Consequently, the capacitance value of the variable capacitor section $C_{400}$ becomes $C_{412}$, and the value of the integration signal output by the variable capacitance integrating circuit 410, $V_{sd}$, becomes $$V_{sd}=Q/C_{412} \tag{6}$$

This integration signal is input to the comparing circuit $A_{402}$, which compares the value thereof in size with the maximum voltage value $V_{max}$.

Thereafter, by performing similar feedback involving the variable capacitance integrating circuit 410, comparing circuit $A_{402}$ and capacitance control section 420, the capacitance value of the variable capacitor section $C_{400}$ is repeatedly set and the value of the integration signal and the maximum voltage value $V_{max}$ are repeatedly compared in size, until the capacitance control section 420 determines that the value of the integration signal and the reference potential $V_{max}$ are matching, within a prescribed resolution. Upon terminating capacitance control of all of the capacitors $C_{411}$–$C_{414}$ of the variable capacitor section $C_{400}$, the capacitance control section 420 output a digital signal corresponding to the final capacitance value of the variable capacitor section C400 to the read-out section 430.

At the read-out section 430, the digital signal output by the capacitance control section 420 is input as an address, and digital data stored at a corresponding address in a memory element is output as an optical detection signal of the photo-detecting apparatus relating to the present invention. As described above, the signal voltage $V_{13}$ corresponding to the intensity of spot light detected by the photodiode PD of the first unit $100_1$ is converted to a digital signal by the A/D converting circuit 400, and this digital signal is output as an optical detection signal. Thereafter, in a similar manner, the signal voltages $V_{n3}$ corresponding to the intensity of spot light detected by the photodiodes PD in the second and subsequent units $100_n$ are converted to digital signals by the A/D converting circuit 400, and these digital signals are successively output as optical detection signals.

Since the maximum value of the respective signal voltages $V_{n3}$ input to the variable capacitance integrating circuit 410 is $V_{max}$, and the maximum value of the capacitance value of the variable capacitor section $C_{400}$ is $C_0$, then according to equation (3) above, the maximum value of the electric charge Q flowing into the variable capacitor section $C_{400}$ will be $V_{max} \cdot C_0$. If a certain nth signal voltage $V_{n3}$ is equal to the maximum voltage value $V_{max}$, then the switches $SW_{411}$–$SW_{414}$ of the variable capacitor section $C_{400}$ are all closed and the capacitance value of the variable capacitor section $C_{400}$ becomes $C_0$. On the other hand, if another nth signal voltage $V_{n3}$ has a value lower than the maximum voltage value $V_{max}$, then since the electric charge Q flowing into the variable capacitor section $C_{400}$ is smaller than $V_{max} \cdot C_0$, the integration signal output from the variable capacitance integrating circuit 410 will become equal to the maximum voltage value $V_{max}$ by opening any of the switches $SW_{411}$–$SW_{414}$ of the variable capacitor section $C_{400}$.

As described above, the maximum voltage value $V_{max}$ output from the maximum value detecting circuit 200 and input to the comparing circuit $A_{402}$ specifies a maximum value for the signal voltage, $V_{n3}$, in other words, an A/D conversion range, wherein A/D conversion can be performed without the A/D converting circuit 400 becoming saturated. Moreover, since one of the respective signal voltages $V_{n3}$ input to the A/D converting circuit 400 is always a maximum voltage value $V_{max}$, it is possible to utilize effectively the full scope of the aforementioned A/D conversion range. In other words, the photo-detecting apparatus relating to the present invention provides excellent A/D conversion resolution when the intensity of the incident light is small, without becoming saturated when the intensity of the incident light is large.

Moreover, if only the image of the spot light is obtained, by subtracting the detection results for the background light component from the detection results of the spot light component and background light component, as in a case where the photo-detecting apparatus is used as a range sensor, then even if the background light component is large compared to the spot light component, in the light detected by the photodiodes PD, the digital signal output by the A/D converting circuit 400 on the basis of the spot light component obtained by the aforementioned subtraction operation will still have excellent resolution.

Moreover, in the aforementioned embodiment, when both the spot light component and background light component are detected by the photodiodes PD, the differential $V_{n1}$ in the signal voltage output by the integrating circuit 10 over a fixed time period T is held in the capacitor $C_{22}$ of the CDS circuit 20. Furthermore, when only the background light component is detected by the photodiodes PD, the differential $V_{n2}$ in the signal voltage output by the integrating circuit 10 over a fixed time period T is held in the capacitor $C_{23}$ of the CDS circuit 20. Subsequently, the signal voltage $V_{n2}$ corresponding to the difference between the voltage value Vn1 and the voltage value $V_{n2}$ is determined by the differential calculating circuit 30 and output to the hold circuit 40. Therefore, the voltage value $V_{n1}$ and voltage value $V_{n2}$ output from the CDS circuit 20, and the signal voltage $V_{n3}$ output by the hold circuit 40, are all values from which the noise component generates by the integrating circuit 10 has been removed.

Figure 11:
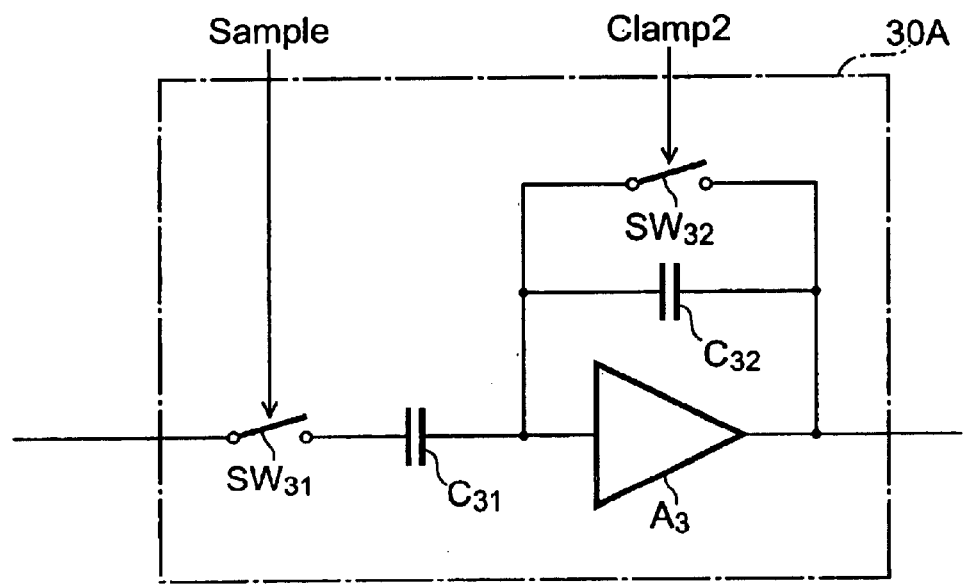
FIG. 11 is a circuit diagram of a differential calculating circuit of a photo detecting apparatus relating to a further embodiment.

Next, a further embodiment of a differential calculating circuit of a photo-detecting apparatus relating to the present invention will be described. FIG. 11 in a circuit diagram of a differential calculating circuit 30A of a photo-detecting apparatus relating to a further embodiment. This differential calculating circuit 30A is used in place of the differential calculating circuit 30 in FIG. 1. The differential calculating circuit 30A of each unit $100_n$ comprises a switch $SW_{31}$, capacitor $C_{31}$ and amp $A_3$ in series between the input terminal and output terminal thereof, and furthermore, a switch $SW_{32}$ and capacitor $C_{32}$ connected mutually in parallel between the input and output of the amp $A_3$. This differential calculating circuit 30A, illustrated in FIG. 11, functions in an approximately similar manner to that shown in FIG. 3. More specifically, by closing the switch $SW_{31}$ for a prescribed period of time whilst the switch $SW_{32}$ is closed, this differential calculating circuit 30A charges the capacitor $C_{32}$ with an electric charge Q1 flowing from the CDS circuit 20 via the capacitor $C_{31}$. Thereupon, by closing the switch $SW_{31}$ for a prescribed period of time whilst the switch $SW_{32}$ is open, an electric charge Q2 of the charge having flown in from the CDS circuit 20 via the capacitor $C_{31}$ is discharged from the capacitor $C_{32}$. In this way, the difference between the electric charge Q1 and the electric charge Q2, in other words, electric charge (Q1–Q2), is integrated in the capacitor $C_{32}$, and a signal voltage corresponding to this integrated electric charge (Q1–Q2) is output from the amp A3. The switch $SW_{31}$ is opened and closed on the bases of a Sample signal output from the timing control circuit 300. The switch $SW_{32}$ is opened and closed on the basis of a Clamp2 signal output by the timing control circuit 300.

The present invention is not limited to the embodiments described above and may be modified variously. For example, the signal voltages $V_{n3}$ from the hold circuits 40 of the respective units $100_n$ may be output successively as output signals of the photo-detecting apparatus, without providing the A/D converting circuit 400.

Moreover, although the foregoing embodiments described a photo-detecting apparatus having two or more photodiodes, in other words, an imaging device, it is also possible to apply the present invention to a photo-detecting apparatus having one photodiode. In this case, it is sufficient to supply just one set of photodiode PD, integrating circuit 10, CDS circuit 20 and differential calculating circuit 30 (or 30A), and an excellent S/N ratio is obtained in a similar manner.

Moreover, in the foregoing embodiments, the maximum value of the signal voltages $V_{n3}$ output by the hold circuits 40 of the respective units 100n was detected by the maximum value detecting circuit 200, but it is also possible to detect the maximum value of the signal voltages output by the differential calculating circuits 30 (or 30A) of the respective units $100_n$, by the maximum value detecting circuit 200.

As described in detail above, according to the present invention, an electric signal current corresponding to the intensity of the incident light is output by a photodiode(s), an electric charge is integrated in an integrating circuit in accordance with the electric signal current output by the photodiode, and a signal voltage corresponding to the amount of electric charge thus integrated is output. In the CDS circuit, the signal voltage output by the integrating circuit is input to a first capacitor, and electric charge corresponding to the amount of change in this input signal voltage is integrated in either one of a second or third capacitors selected by switches. Thereupon, in a differential calculating circuit, the difference between the electric charges integrated respectively in the second and third capacitors of the CDS circuit is determined, and a signal voltage corresponding to this difference is output.

Consequently, even if the integrating circuit has noise fluctuation which changes with each integration operation, the noise error is eliminated by the CDS circuit. Moreover, since an electric charge corresponding to the spot light component (signal light component) and the background light component is integrated in either one of the second or third capacitors of the CDS circuit during the first period, whilst the electric charge corresponding to the background light component is integrated in the other capacitor during a second period, and the differential between the two electric charges is determined by a differential calculating circuit during a third period, then the signal voltage output by the differential calculating circuit corresponds to the spot light component (signal light component) only. In this way, even if the intensity of the incident light detected by the photodiode, in other words, the aforementioned signal voltage value, is small, then the S/N ratio of the light detection is excellent.

Moreover, if the sequence of integration of electric charge in the integrating circuits has to be changed, in accordance with the light emission timing of the projection devices LE, such as light-emitting diodes, or the like, in other words, if the aforementioned first time period and second time period have to be changed, then in the prior art, since the circuitry following the integrating circuit is fixed and is only permitted to operate with a single polarity, this kind of change cannot be made. However according to the present invention, since the second and third capacitors of the CDS circuit can battery controlled in a mutually independent fashion, the information integrated therein can also be extracted in a mutually independent fashion. In other words, according to the present invention, the first time period and second time period can be changed readily.

Moreover, N sets of photodiodes, integrating circuits, CDS circuits, differential calculating circuits, and hold circuits are provided, the signal voltages output by the differential calculating circuit in each set being held by a hold circuit, the signal voltages output respectively from the N hold circuits being input successively to an A/D converting circuit, which converts these signal voltages to digital signals that are then output. In this case, a one-dimensional image or two-dimensional image is formed, and the formed image is output as a digital signal Furthermore, the maximum value of the signal voltages output respectively by the N differential calculating circuits or hold circuits is detected by a maximum value detecting circuit, and an A/D conversion range is set in the A/D converting circuit on the basis of the maximum value thus detected by the maximum value detecting circuit, whereby excellent resolution is obtained even when the intensity of the light is small, without the signal becoming saturated when the intensity of the incident light is large.

What is claimed is:

1. A photo-detecting apparatus characterized by comprising:

a photodiode for outputting an electric signal current corresponding to the intensity of the incident light;

an integrating circuit integrating electric charge according to the electric signal current output by said photodiode and outputting a signal voltage corresponding to the electric charge thus integrated;

a CDS having: a first capacitor and amplifier provided in sequence between an input terminal inputting the signal voltage output by said integrating circuit and an output terminal, a second capacitor and third capacitor having mutually equal capacitance values, provided in parallel between the input and output of said amplifier, and switches for selecting either one of said second or third capacitors so as to integrate electric charge corresponding to the amount of change in said signal voltage; and a differential calculating circuit for determining the differential between the electric charges integrated respectively in said second and said third capacitors at said CDS circuit, and outputting a signal voltage corresponding to this differential.

2. The photo-detecting apparatus according to claim 1, characterized in that said photo-detecting apparatus comprises N sets (where $N \geq 2$) of said photodiodes, said integrating circuit, said CDS circuit and said differential, calculating circuit are provided, and further comprises:

N hold circuits provided respectively with respect to said N differential calculating circuits, for holding and outputting the signal voltages output by the respective differential calculating circuits; and an A/D converting circuit for successively inputting the signal voltages output respectively by said N hold circuits, converting said signal voltages to digital signals, and outputting said digital signals.

3. The photo-detecting apparatus according to claim 2, characterized by further comprising a maximum value detecting circuit for detecting the maximum value or signal voltages output respectively by said N differential calculating circuits or said N holds circuits; wherein said A/D converting circuit sets an A/D conversion range on the basis of the maximum value detected by said maximum value detecting circuit.

4. A photo-detecting apparatus characterized by comprising: a photoelectrical converting element for outputting an electrical signal in accordance with incidence of light; two capacitors interposed in parallel between the inverse input terminal and output terminal of an operational amplifier, which connect between said input and output terminals selectively; and an amplifying circuit for amplifying the output of said operational amplifier;

wherein an output signal from said photoelectric converting element when light is incident is input to said inverse input terminal when one of said capacitors is connected, and an output signal from said photoelectric converting element when no light is incident is input to said inverse input terminal when the other of said capacitors is connected.

* * * * *

UNITED STATES PATENT AND TRADEMARK OFFICE
CERTIFICATE OF CORRECTION

| | | |
|---|---|---|
| PATENT NO. | : 6,757,627 B2 | |
| APPLICATION NO. | : 09/983922 | |
| DATED | : June 29, 2004 | |
| INVENTOR(S) | : Mizuno | |

It is certified that error appears in the above-identified patent and that said Letters Patent is hereby corrected as shown below:

Claim 1, col. 15, line 40, delete the text beginning with "1. A photo-detecting apparatus" to and ending with "this differential." in column 16, line 12, and insert the following claim:

1. A photo-detecting apparatus comprising:
      a photodiode;
      an integrating circuit;
      a CDS circuit having
            an operational amplifier,
            a first capacitor arranged between an input terminal of said operational amplifier of said integrating circuit,
            a second capacitor arranged between said input terminal and the output terminal of said operational amplifier, and
            a third capacitor arranged between the input terminal and the output terminal of said operational amplifier, said second capacitor and said third capacitor having mutually equal capacitance values, provided in parallel between the input and output terminal of said operational amplifier,
            switches for selecting either one of said second or third capacitors so as to integrate electric charge corresponding to the amount of change in a signal voltage from said integrating circuit;
            a differential calculating circuit, wherein said photodiode, said integrating circuit, and said CDS circuit and said differential calculating circuit are sequentially connected;
            light projecting means for projecting spot light onto an object; and

UNITED STATES PATENT AND TRADEMARK OFFICE
CERTIFICATE OF CORRECTION

PATENT NO. : 6,757,627 B2
APPLICATION NO. : 09/983922
DATED : June 29, 2004
INVENTOR(S) : Mizuno It is certified that error appears in the above-identified patent and that said Letters Patent is hereby corrected as shown below:

a timing control circuit that controls the switches of said CDS circuit, said light projecting means and said differential calculating circuit as follows:
          the spot light is emitted from said light projecting means during a first period and is not emitted during a second period,
          a first electric charge is integrated in said second capacitor of said CDS circuit on the basis of the amount of change of the signal voltage output from said integrating circuit in the first period,
          a second electric charge is integrated in the third capacitor of said CDS circuit on the basis of the amount of change in the signal voltage output from said integrating circuit in the second period, and
          a difference between the electric charges integrated respectively by said second and said third capacitors of said CDS circuit is calculated by said differential calculating circuit in a third period that is set after said first and said second periods, so that the signal voltage corresponding to this difference is output by said differential calculating circuit.

Claim 2, col. 16, line 16, delete the second occurrence of ",".

Claim 2, col. 16, line 17, delete "are provided".

Claim 3, col. 16, line 27, delete "characterized by".

Claim 4, col. 16, line 34, delete the text beginning with "4. A photo-detecting apparatus" to and ending with "capacitors is connected." in column 16, line 48, and insert the following claim:

UNITED STATES PATENT AND TRADEMARK OFFICE
CERTIFICATE OF CORRECTION

PATENT NO. : 6,757,627 B2
APPLICATION NO. : 09/983922
DATED : June 29, 2004
INVENTOR(S) : Mizuno It is certified that error appears in the above-identified patent and that said Letters Patent is hereby corrected as shown below:

4. A photo-detecting apparatus comprising:
    a photoelectrical converting element for outputting an electrical signal in accordance with incidence of light; two capacitors interposed in parallel between the inverse input terminal and output terminal of an operational amplifier, each of said capacitors being configured to selectively connect said input terminal of said operational amplifier and said output terminal of said operational amplifier; and an amplifying circuit for amplifying the output of said operational amplifier;
    wherein an output signal from said photoelectric converting element when light is incident is input to said inverse input terminal when one of said capacitors connects said input terminal of said operational amplifier and said output terminal of said operational amplifier, and an output signal from said photoelectric converting element when no light is incident is input to said inverse input terminal when the other of said capacitors connects said input terminal of said operational amplifier and said output terminal of said operational amplifier.

Signed and Sealed this

Third Day of October, 2006

JON W. DUDAS
*Director of the United States Patent and Trademark Office*